(12) United States Patent
Tu et al.

(10) Patent No.: US 8,563,351 B2
(45) Date of Patent: Oct. 22, 2013

(54) METHOD FOR MANUFACTURING PHOTOVOLTAIC DEVICE

(75) Inventors: Chih-Chiang Tu, Tauyen (TW); Chun-Lang Chen, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 457 days.

(21) Appl. No.: 12/823,667

(22) Filed: Jun. 25, 2010

(65) Prior Publication Data

US 2011/0318863 A1    Dec. 29, 2011

(51) Int. Cl.
*H01L 21/00* (2006.01)

(52) U.S. Cl.
USPC ............... 438/68; 438/57; 438/66; 438/67; 438/84; 136/244; 136/256

(58) Field of Classification Search
USPC .................. 438/96, 71, 57, 66, 67, 84
See application file for complete search history.

(56) References Cited

U.S. PATENT DOCUMENTS

| | | | | |
|---|---|---|---|---|
| 4,428,110 A | * | 1/1984 | Kim | 438/80 |
| 4,645,866 A | * | 2/1987 | Nitta | 136/244 |
| 4,661,370 A | * | 4/1987 | Tarrant | 427/540 |
| 4,667,058 A | * | 5/1987 | Catalano et al. | 136/244 |
| 4,680,855 A | * | 7/1987 | Yamazaki et al. | 219/121.69 |
| 4,689,874 A | * | 9/1987 | Nishiura | 438/80 |
| 4,758,526 A | * | 7/1988 | Thalheimer | 438/80 |
| 4,999,308 A | * | 3/1991 | Nishiura et al. | 438/80 |
| 5,103,268 A | * | 4/1992 | Yin et al. | 257/750 |
| 5,133,809 A | * | 7/1992 | Sichanugrist et al. | 136/249 |
| 5,348,589 A | * | 9/1994 | Arai et al. | 136/244 |
| 5,558,723 A | * | 9/1996 | Ufert | 136/244 |
| 5,637,156 A | * | 6/1997 | Kubota et al. | 136/251 |
| 5,688,366 A | * | 11/1997 | Ichinose et al. | 438/754 |

(Continued)

FOREIGN PATENT DOCUMENTS

| | | |
|---|---|---|
| CN | 101359701 A | 2/2009 |
| KR | 10-2009-0108476 A | 10/2009 |
| KR | 10-2010-0003690 A | 1/2010 |
| KR | 10-2010-0021034 A | 2/2010 |

OTHER PUBLICATIONS

Gao, L. Jay, "Recent Progress in Nanoimprint Technology and Its Applications," Institute of Physics Publishing, Journal of Physics D: Applied Physics, J. Phys D: Appl. Phys. 37 (2004) R-123-141, PII: S0022-3727(04)57046-8, 022-3727/04/110123+19$30.00, 2004 IOP Publishing Ltd.

(Continued)

*Primary Examiner* — Kimberly Rizkallah
*Assistant Examiner* — Caleb Henry
(74) *Attorney, Agent, or Firm* — Duane Morris LLP

(57) ABSTRACT

A photovoltaic device manufacturing method is disclosed. Methods include manufacturing a photovoltaic cell using nanoimprint technology to define individual cell units of the photovoltaic device. The methods can include providing a substrate; forming a first conductive layer over the substrate; forming first grooves in the first conductive layer using a nanoimprint and etching process; forming an absorption layer over the first conductive layer, the absorption layer filling in the first grooves; forming second grooves in the absorption layer using a nanoimprint process; forming a second conductive layer over the absorption layer, the second conductive layer filling in the second grooves; and forming third grooves in the second conductive layer and the absorption layer, thereby defining a photovoltaic cell unit.

20 Claims, 14 Drawing Sheets

(56) References Cited

U.S. PATENT DOCUMENTS

| | | | |
|---|---|---|---|
| 5,956,572 A * | 9/1999 | Kidoguchi et al. | 438/96 |
| 6,069,313 A * | 5/2000 | Kay | 136/249 |
| 6,127,623 A * | 10/2000 | Nakamura et al. | 136/256 |
| 6,168,968 B1 * | 1/2001 | Umemoto et al. | 438/96 |
| 6,287,888 B1 * | 9/2001 | Sakakura et al. | 438/96 |
| 7,745,313 B2 * | 6/2010 | Wang et al. | 438/479 |
| 8,066,840 B2 * | 11/2011 | Narasimhan et al. | 156/251 |
| 8,098,208 B2 * | 1/2012 | Ficker et al. | 343/841 |
| 8,133,752 B2 * | 3/2012 | Hayes | 438/64 |
| 8,173,483 B2 * | 5/2012 | Lee et al. | 438/96 |
| 8,294,026 B2 * | 10/2012 | Wang et al. | 136/256 |
| 8,318,528 B2 * | 11/2012 | Kruglick | 438/73 |
| 2002/0011641 A1 * | 1/2002 | Oswald et al. | 257/447 |
| 2002/0117199 A1 * | 8/2002 | Oswald | 136/256 |
| 2002/0119592 A1 * | 8/2002 | Oswald et al. | 438/96 |
| 2006/0196536 A1 * | 9/2006 | Fujioka et al. | 136/244 |
| 2006/0266409 A1 * | 11/2006 | Takeda et al. | 136/252 |
| 2007/0163646 A1 * | 7/2007 | Kushiya et al. | 136/264 |
| 2007/0254208 A1 * | 11/2007 | Kurt et al. | 429/126 |
| 2008/0050564 A1 | 2/2008 | Fujikawa et al. | |
| 2008/0105303 A1 * | 5/2008 | Oswald et al. | 136/261 |
| 2008/0248404 A1 * | 10/2008 | Chen et al. | 430/5 |
| 2008/0264478 A1 * | 10/2008 | Ahn et al. | 136/255 |
| 2008/0308150 A1 * | 12/2008 | Schindler | 136/256 |
| 2009/0020853 A1 * | 1/2009 | Kayes et al. | 257/618 |
| 2009/0046362 A1 * | 2/2009 | Guo et al. | 359/486 |
| 2009/0133751 A1 * | 5/2009 | Sreenivasan et al. | 136/256 |
| 2009/0162970 A1 * | 6/2009 | Yang | 438/96 |
| 2009/0215224 A1 | 8/2009 | Li et al. | |
| 2009/0217966 A1 * | 9/2009 | Eo et al. | 136/244 |
| 2009/0227062 A1 * | 9/2009 | Sullivan et al. | 438/61 |
| 2009/0231714 A1 | 9/2009 | Zhao et al. | |
| 2009/0242018 A1 * | 10/2009 | Ahn et al. | 136/255 |
| 2009/0255572 A1 * | 10/2009 | Oswald | 136/251 |
| 2009/0272429 A1 * | 11/2009 | Lu et al. | 136/252 |
| 2009/0283131 A1 * | 11/2009 | Kushiya et al. | 136/244 |
| 2009/0308440 A1 | 12/2009 | Adibi et al. | |
| 2009/0314337 A1 * | 12/2009 | Lee et al. | 136/255 |
| 2010/0012167 A1 * | 1/2010 | Milshtein et al. | 136/244 |
| 2010/0013037 A1 * | 1/2010 | Park et al. | 257/431 |
| 2010/0059100 A1 * | 3/2010 | Kim et al. | 136/256 |
| 2010/0059103 A1 * | 3/2010 | Ahn et al. | 136/246 |
| 2010/0059111 A1 * | 3/2010 | Shin et al. | 136/256 |
| 2010/0078064 A1 * | 4/2010 | Coakley | 136/246 |
| 2010/0126577 A1 | 5/2010 | Wu et al. | |
| 2010/0126583 A1 * | 5/2010 | Lee et al. | 136/256 |
| 2010/0132765 A1 * | 6/2010 | Cumpston et al. | 136/249 |
| 2010/0159633 A1 * | 6/2010 | Lee et al. | 438/88 |
| 2010/0180935 A1 * | 7/2010 | Chen | 136/255 |
| 2010/0186796 A1 * | 7/2010 | Lee et al. | 136/244 |
| 2010/0193006 A1 * | 8/2010 | Kang et al. | 136/244 |
| 2010/0197072 A1 * | 8/2010 | Kim et al. | 438/72 |
| 2010/0200043 A1 * | 8/2010 | Lombardo et al. | 136/244 |
| 2010/0236619 A1 * | 9/2010 | Tsutsumi et al. | 136/256 |
| 2010/0252090 A1 * | 10/2010 | Milshtein et al. | 136/244 |
| 2010/0258159 A1 * | 10/2010 | Hong et al. | 136/244 |
| 2010/0267186 A1 * | 10/2010 | Wang et al. | 438/71 |
| 2010/0267192 A1 * | 10/2010 | Mei et al. | 438/96 |
| 2010/0267193 A1 * | 10/2010 | Lee et al. | 438/96 |
| 2010/0314705 A1 * | 12/2010 | Repmann et al. | 257/443 |
| 2010/0323471 A1 * | 12/2010 | Le et al. | 438/96 |
| 2011/0000537 A1 * | 1/2011 | Myong | 136/256 |
| 2011/0011436 A1 * | 1/2011 | Kruglick | 136/244 |
| 2011/0011453 A1 * | 1/2011 | Kang | 136/256 |
| 2011/0061706 A1 * | 3/2011 | Park et al. | 136/244 |
| 2011/0155234 A1 * | 6/2011 | Chou et al. | 136/256 |
| 2011/0156320 A1 * | 6/2011 | Chen et al. | 264/483 |
| 2011/0162684 A1 * | 7/2011 | Kim et al. | 136/244 |
| 2011/0169027 A1 * | 7/2011 | Park et al. | 257/98 |
| 2011/0180134 A1 * | 7/2011 | Kim et al. | 136/256 |
| 2011/0263108 A1 * | 10/2011 | Lan et al. | 438/492 |
| 2012/0003780 A1 * | 1/2012 | Tu et al. | 438/71 |
| 2012/0021555 A1 * | 1/2012 | Tu et al. | 438/71 |
| 2012/0077303 A1 * | 3/2012 | Jeong et al. | 438/87 |

OTHER PUBLICATIONS

K.L. Chopra et al., "Thin-Film Solar Cells: An Overview", Progress in Photovoltaics: Research and Applications, Prog. Photovolt: Res. Appl. 2004: 12:69-92 (DOI: 10.1002/pip.541), Dec. 16, 2003, pp. 69-92.

L. Jay Guo, "Nanoimprint Lithography: Methods and Material Requirements", Advanced Materials, 2007, 19, 495-513, 2007 Wiley-VCH Verlag GmbH & Co., KGaA, Weinheim, pp. 495-513.

Official Action issued Aug. 10, 2012, in counterpart Korean Patent Application.

Official Action issued Dec. 5, 2012, in counterpart Chinese Patent Application No. 201010552495.0.

* cited by examiner

METHOD FOR MANUFACTURING PHOTOVOLTAIC DEVICE

TECHNICAL FIELD

The present disclosure relates generally to photovoltaic cells, and more particularly, to a photovoltaic cell manufacturing.

BACKGROUND

Photovoltaic cells (also referred to as solar cells) convert light energy into electricity. Photovoltaic cells and manufacturing thereof are continually evolving to provide higher conversion efficiency. For example, thin film photovoltaic cells have been introduced to provide improved conversion efficiency. Conventional methods for manufacturing thin film photovoltaic devices use laser and mechanical scribing to define, interconnect, and isolate the photovoltaic device into individual, connected photovoltaic cells. It has been observed that these methods can result in low throughput and photovoltaic cell surface damage. Accordingly, although existing methods have been generally adequate for their intended purposes, they have not been entirely satisfactory in all respects.

SUMMARY

The present disclosure provides for many different embodiments. According to one of the broader forms of embodiments of the present invention, a method for manufacturing a photovoltaic device includes: providing a substrate; forming a first conductive layer over the substrate; forming first grooves in the first conductive layer using a nanoimprint and etching process; forming an absorption layer over the first conductive layer, the absorption layer filling in the first grooves; forming second grooves in the absorption layer using a nanoimprint process; forming a second conductive layer over the absorption layer, the second conductive layer filling in the second grooves; and forming third grooves in the second conductive layer and the absorption layer, thereby defining a photovoltaic cell unit.

In another one of the broader forms of embodiments of the present invention, a method includes: providing a substrate; forming a first conductive layer over the substrate; performing a first nanoimprint process, thereby forming a first opening within the first conductive layer that exposes the substrate; forming an absorption layer over the first conductive layer, the absorption layer filling the first opening; performing a second nanoimprint process, thereby forming a second opening within the absorption layer that exposes the first conductive layer; forming a second conductive layer over the absorption layer, the second conductive layer partially filling the second opening; and removing portions of the second conductive layer and the absorption layer, thereby forming a third opening that exposes the first conductive layer.

Yet another one of the broader forms of embodiments of the present invention involves a method for manufacturing a thin film solar cell. The method includes: providing a substrate; performing a first nanoimprint process to form a first electrode over the substrate; performing a second nanoimprint process to form an absorption element over the first electrode; and forming a second electrode over the absorption element

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
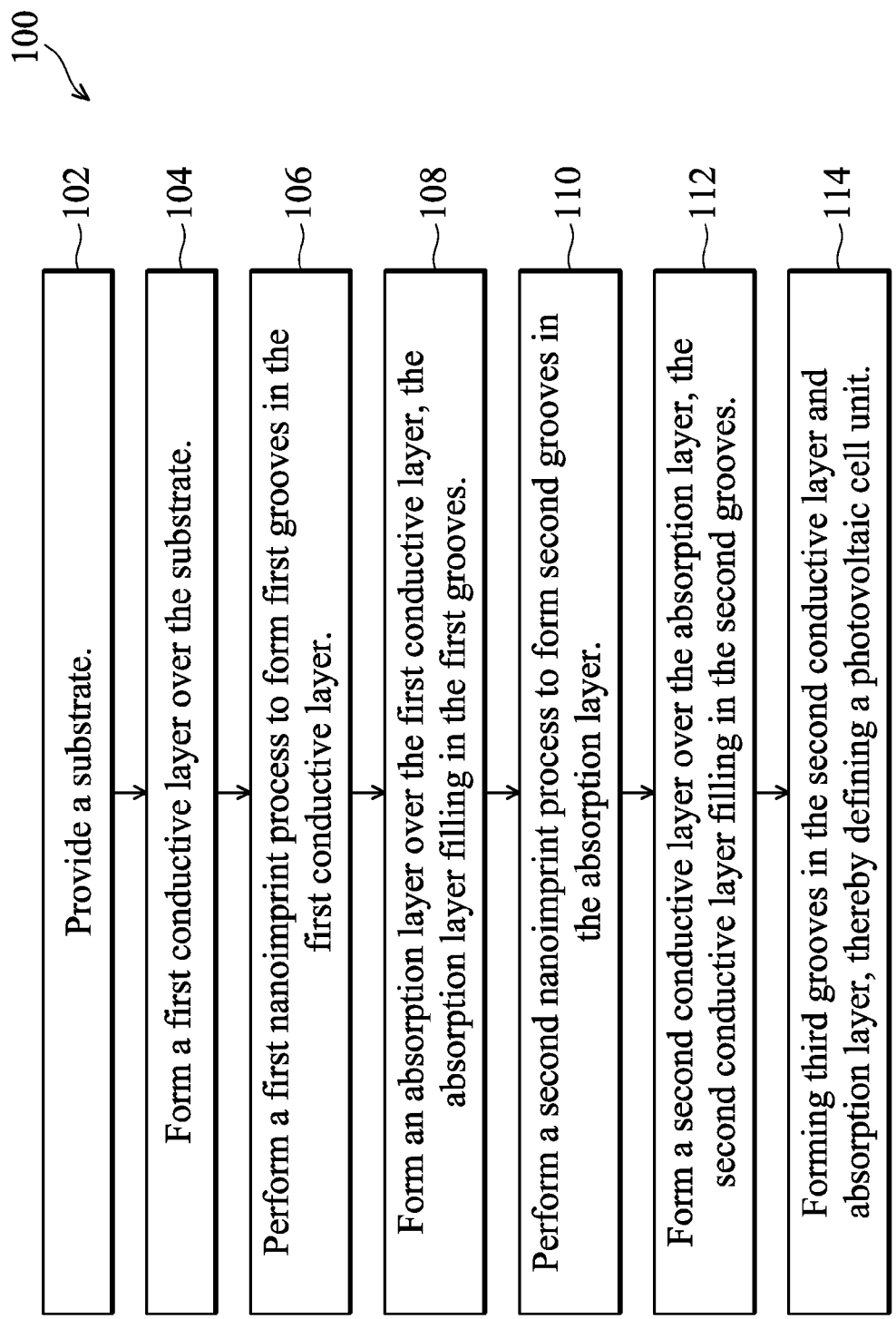
FIG. 1 is a flow chart of a method for fabricating a photovoltaic device according various embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Conventional photovoltaic device manufacturing uses laser or mechanical scribing for defining, interconnecting, and isolating individual cells of a photovoltaic device. For example, patterning the individual cells often requires a three step process: a laser scribing process (for example, to define an electrode, such as the back surface field) and then two mechanical scribing processes (for example, one process to define an interconnect, and one process to define the individual cell units). These processes often result in damage to the photovoltaic cell surface and reduce conversion efficiency and throughput. In contrast, as described in detail below, the disclosed photovoltaic device manufacturing uses nanoimprint technology to define, interconnect and isolate individual cells of the photovoltaic device. Replacing laser and/or mechanical scribing with nanoimprint technology can improve throughput (for example, by eliminating electron-hole pair lateral migration issues) and reduce surface damage to the photovoltaic cells. Further, nanoimprint technology provides high patterning accuracy, which can provide improved alignment within the photovoltaic cells. When compared to conventional manufacturing methods, nanoimprint technology is easily implemented into conventional roll-to-roll manufacturing processes, simplifying manufacturing of photovoltaic devices and reducing manufacturing costs. It is understood that different embodiments may have different advantages, and that no particular advantage is necessarily required of any one embodiment.

FIG. 1 is a flow chart of an embodiment of a method 100 for fabricating a photovoltaic device. As will be discussed further below, the method 100 is utilized to define various features (elements) of a photovoltaic device. For example, the method 100 defines electrode portions, absorption portions, and individual photovoltaic cell units of the photovoltaic device. The method 100 begins at block 102 where a substrate is provided. At blocks 104 and 106, a first conductive layer is formed over the substrate, and a first nanoimprint process is performed to form first grooves in the first conductive layer. At blocks 108 and 110, an absorption layer is formed over the first conductive layer, filling in the first grooves, and a second nanoimprint process is performed to form second grooves in the absorption layer. At block 112, a second conductive layer is formed over the absorption layer, filling in the second grooves. The second conductive layer may only partially fill in the second grooves. At block 114, third grooves are formed in the second conductive layer and absorption layer, thereby defining a photovoltaic cell unit. According to various embodiments, the nanoimprint processes utilize thermal nanoimprinting lithography techniques (including thermoplastic and thermal-curable nanoimprinting), direct imprinting techniques (also referred to as embossing), UV nanoimprinting lithography (UV-NIL) techniques (also referred to as UV-curable nanoimprinting), or combinations thereof. Alternatively, the nanoimprint technology utilizes other nanoimprinting lithography (NIL) techniques known in the art, including future-developed NIL lithography techniques, and combinations thereof. The NIL process is performed in a suitable environment, such as a vacuum environment or an air environment. The NIL process uses various alignment techniques, and the nanoimprint process may utilize an etching process, such as a dry etching process, wet etching process, other suitable etching process, or combinations thereof. Additional steps can be provided before, during, and after the method 100, and some of the steps described can be replaced or eliminated for additional embodiments of the method. The discussion that follows illustrates various embodiments of a photovoltaic device that can be fabricated according to the method 100 of FIG. 1.

FIGS. 2-14 are diagrammatic sectional side views of a photovoltaic device 200 (also referred to as a solar cell), in portion or entirety, at various stages of fabrication according to the method of FIG. 1. The photovoltaic device 200 is a thin film solar cell. FIGS. 2-14 have been simplified for the sake of clarity to better explain the inventive concepts of the present disclosure. Additional features not shown can be added in the photovoltaic device 200, and some of the features described below can be replaced or eliminated for other embodiments of the photovoltaic device 200.

Figure 2:
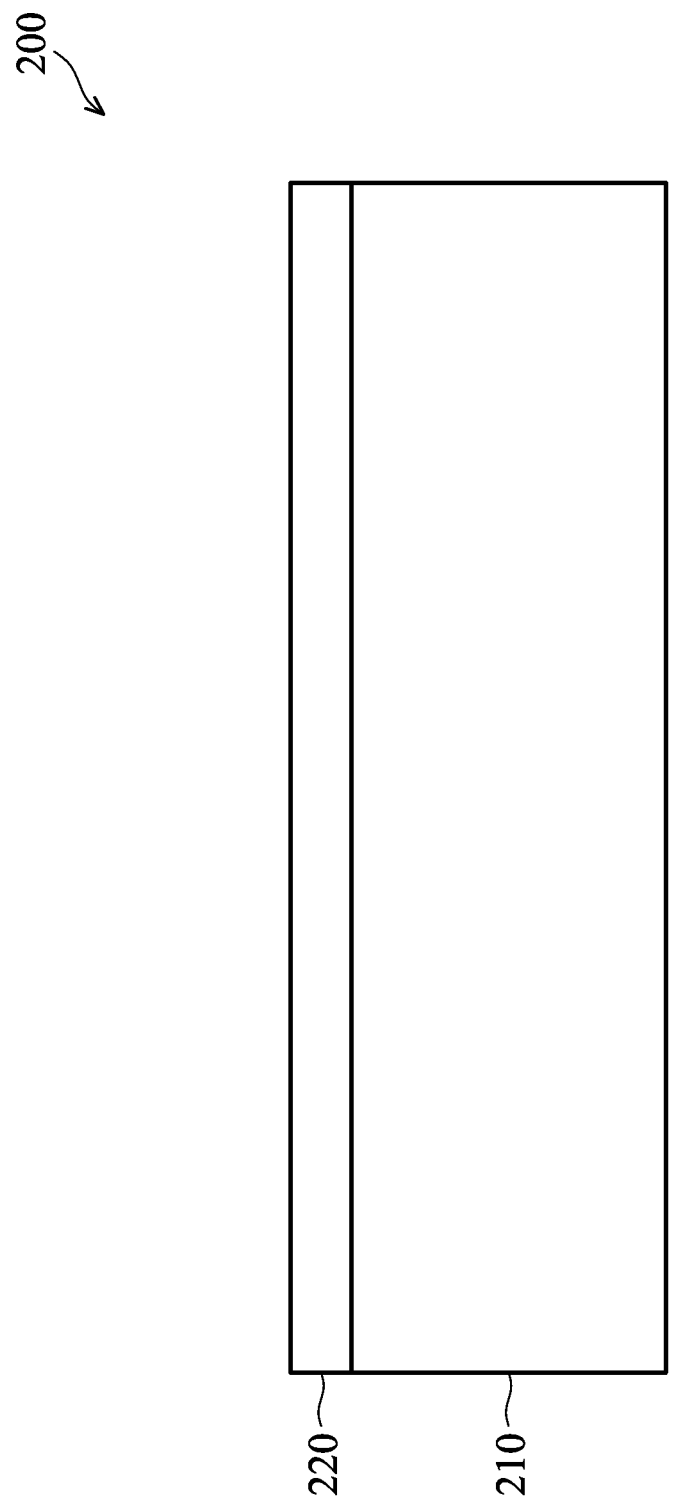
FIGS. 2-14 are various diagrammatic sectional side views of a photovoltaic device during various fabrication stages according to the method of FIG. 1.

In FIG. 2, a substrate 210 is provided having a conductive layer 220 formed thereover. The substrate 210 is any substrate suitable for thin film solar cells. In the depicted embodiment, the substrate 210 is a glass substrate. The glass substrate may be soda lime silicate glass, aluminosilicate glass, lithium aluminosilicate glass, quartz glass, borosilicate glass, alkali-free glass, other suitable glass, or combinations thereof. Alternatively, the substrate 210 is a metal foil (for example, stainless steel, aluminum, or copper) or flexible transparent polymer (for example, polyimide, polyamide, polyethersulfone, polyetherimide, polyethylene naphthalate, or polyester). The substrate 210 may be a flexible substrate.

The conductive layer 220 is disposed over the substrate 210. In the depicted embodiment, the conductive layer 220 is a molybdenum (Mo) layer. The conductive layer 220 is a contact (electrode) layer of the photovoltaic device 200. The conductive layer 220 is a back contact (electrode) layer, and thus, provides a back surface electric field (BSF) for the photovoltaic device 200. Alternatively, the conductive layer 220 may be a Ti, Ni, Al, Nb, W, Cr, Cu, transparent conducting oxide (TCO) layer, other suitable material layer, or combinations thereof.

Figure 3:
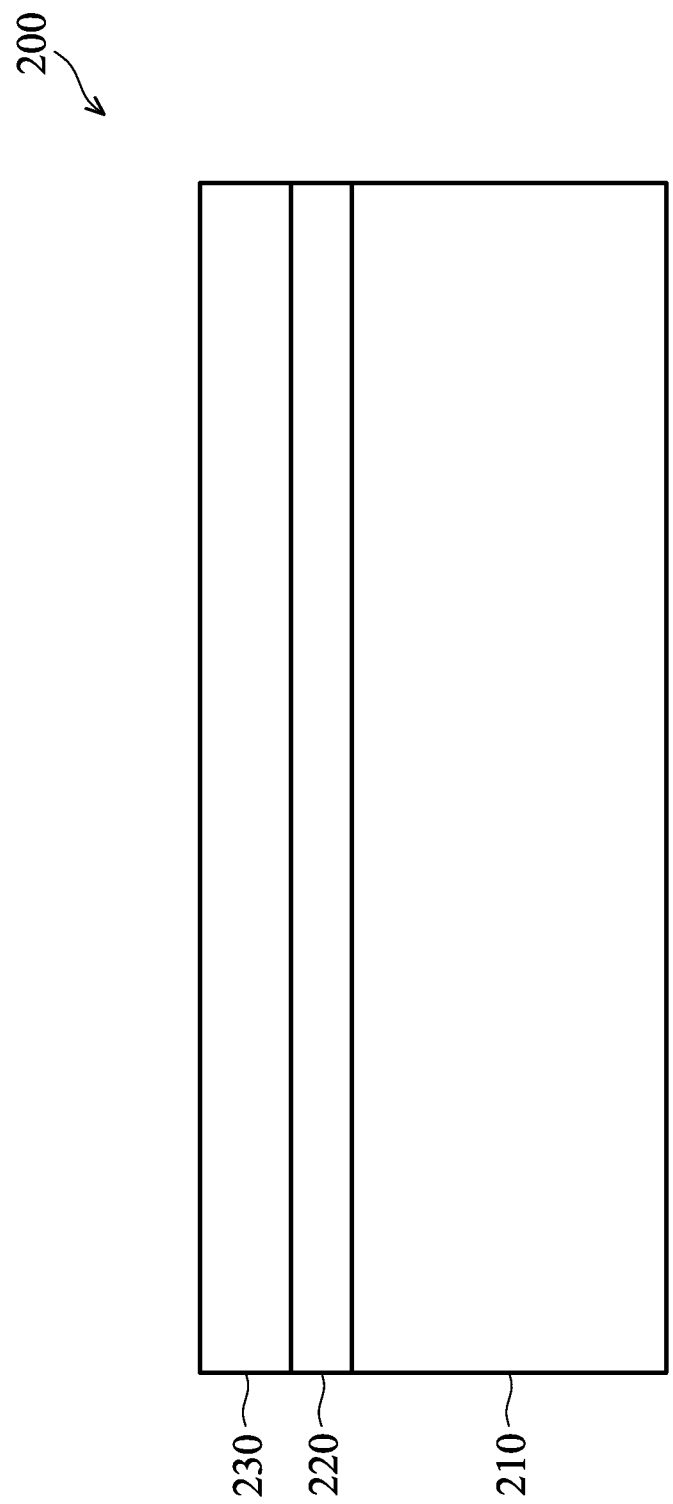
Figure 4:
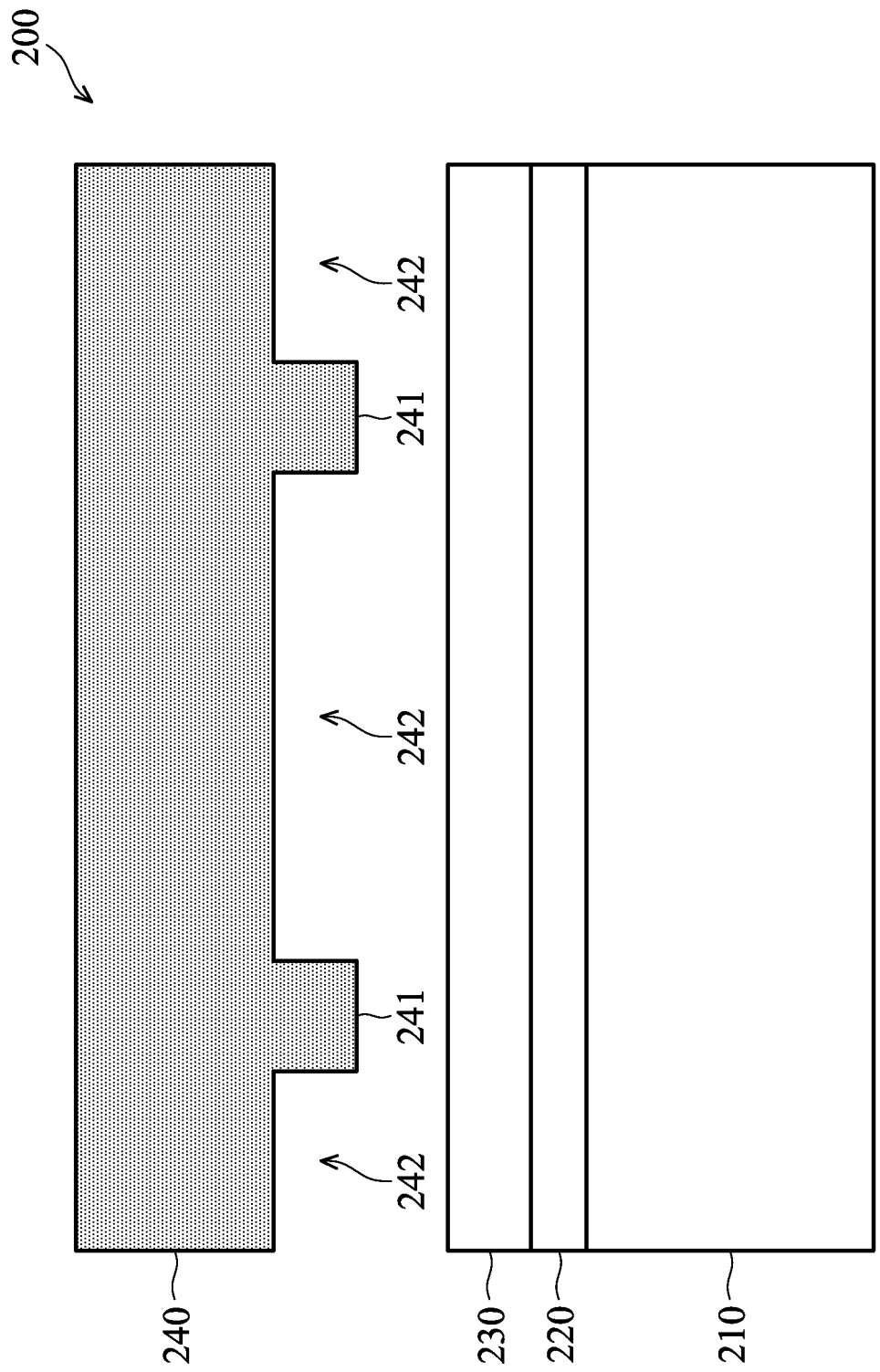

Referring to FIGS. 3-7, the disclosed photovoltaic cell process defines and patterns the back contact layer, which in the depicted embodiment is the conductive layer 220, using nanoimprint technology. In FIG. 3, a material layer 230 (also referred to as an intermedium or shielding layer) is formed over the substrate 210 and conductive layer 220 by a spin coating, flat scrubbing, or other suitable process. The material layer 230 is a resist layer. The resist layer is a homopolymer resist, such as PMMA (polymethylmethacrylate) or PS (polystyrene); thermal plastic resist; UV-curable resist; resist including siloxane copolymers, such as PDMS (poly(dimethyl siloxane))-organic block or graft copolymers; thermally curable liquid resist; UV-curable liquid resist (for room temperature nanoimprinting, for example); other suitable resists known in the art; future-developed resist; or combinations thereof. In the depicted embodiment, the material layer 230 is a PMMA layer. The material layer 230 may comprise a multilayer structure. The material layer 230 has a suitable thickness, for example, less than or equal to about 1 μm.

Referring to FIGS. 4-7, a mold 240 is pressed into the material layer 230 and removed, thereby imprinting the material layer 230 with a predetermined pattern. The mold 240 is made of a suitable material, such as quartz ($SiO_2$), silicon, SiC, silicon nitride, metal, sapphire, diamond, resin, other suitable mold material known in the art, future-developed mold material, or combinations thereof. In an example, the mold 240 may be quartz having a patterned metal layer, such as chromium (Cr), forming the predetermined pattern. In another example, the mold 240 may be quartz having a patterned MoSi layer forming the predetermined pattern. The mold 240 includes protrusion features 241 and openings 242 (also referred to as trenches or cavities) that form the predetermined pattern. The predetermined pattern is any suitable design, and thus, the protrusion features 241 and openings 242 may have various shapes and designs depending on a particular pattern or feature desired. In the depicted embodiment, the predetermined pattern of the mold 240 defines the BSF pattern, particularly the pattern of the conductive layer 220.

Figure 5:
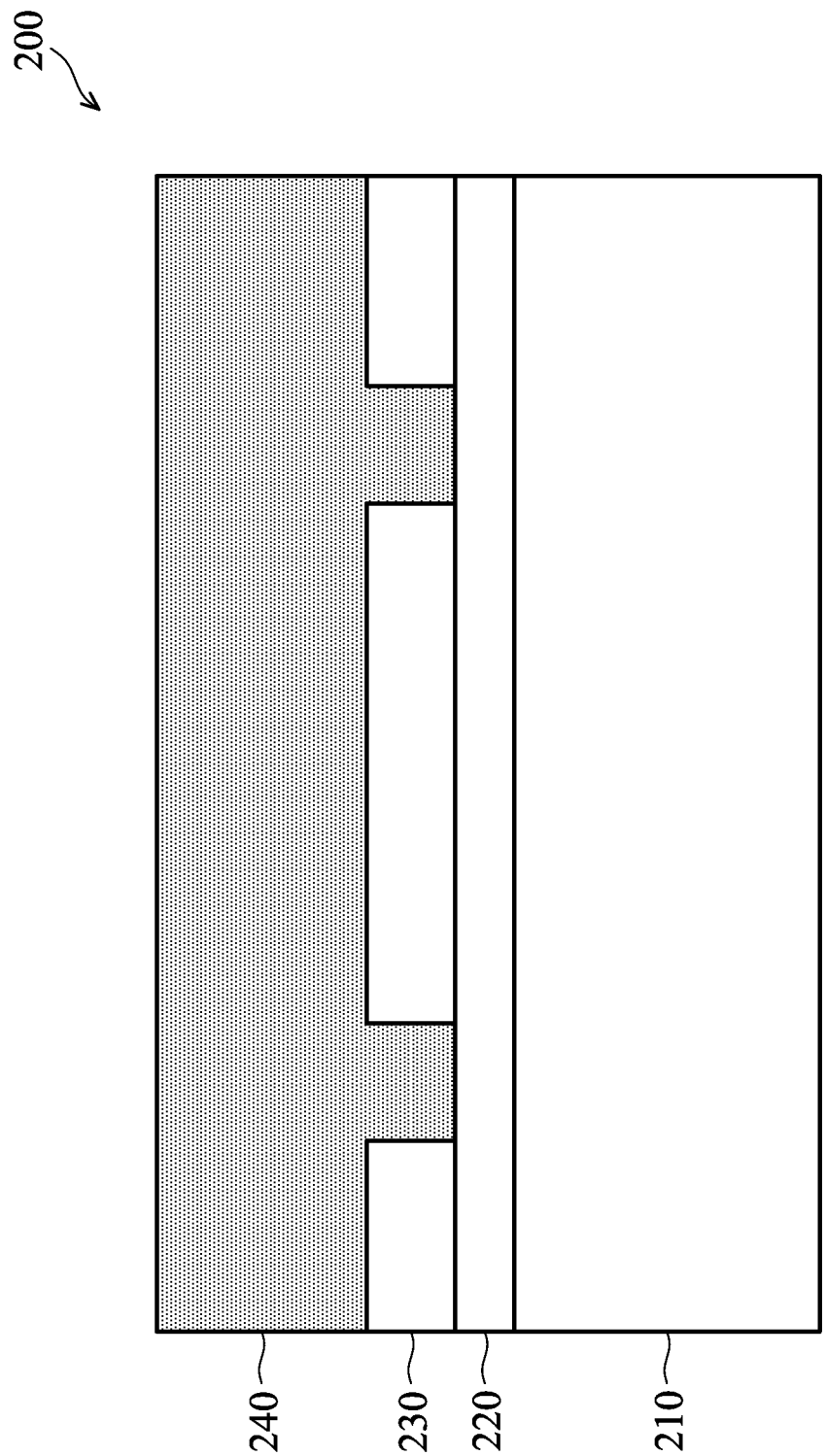
Figure 6:
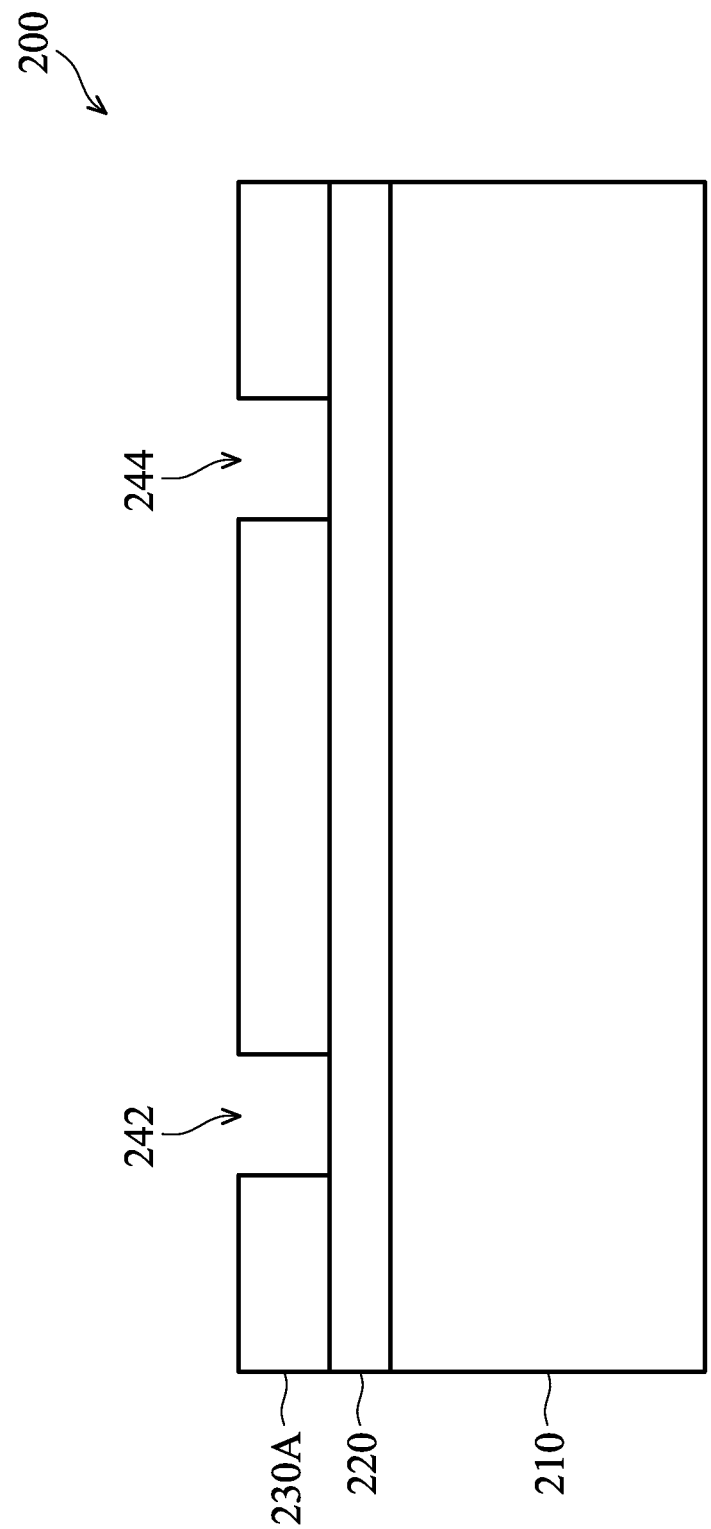

As noted above, the mold 240 is pressed into the material layer 230 (FIGS. 4 and 5) at a suitable temperature and pressure, thereby creating a thickness contrast in the material layer 230 to form a patterned material layer. More specifically, the predetermined pattern of the mold 240 is transferred to the material layer 230 because the material layer 230 underneath the protrusion features 241 is displaced and transported to the trenches or cavities 242 of the mold 240 (FIG. 5). The temperature and pressure is selected based on properties of the mold 240 and material layer 230, and the imprinting is performed in a vacuum or in air. The material layer 230 is cured and set so that the material layer 230 hardens and assumes its displaced shape. This ensures that the material layer 230 will not flow back into the spaces created by the displacement when the mold 240 is removed. For example, where the material layer 230 is a thermal resist, the temperature may be raised higher than its glass transition temperature so that the material layer 230 changes to a liquid state, such that it is displaced and transported into the trenches or cavities 242 of the mold 240. Once the material layer 230 conforms to the pattern of the mold 240, the temperature may be brought below the material layer's glass transition temperature to solidify the material layer 230. In another example, where the material layer 230 is a thermal or UV curable material, the material layer 230 may initially be in a liquid state, such that it conforms to the mold 240 when pressed into the material layer 230, and then, solidifies when cured by a thermal curing, UV curing, or combination thereof. Other curing and setting processes may be used. When the mold 240 is removed, a patterned material layer 230A remains as illustrated in FIG. 6. Openings (trenches or grooves) 242 and 244 expose portions of the conductive layer 220. The patterned material layer 230A shields other portions of the conductive layer 220 from subsequent processing (such as an etching process). A thin residual layer of the material layer 230 may remain over the exposed portions of the conductive layer 220.

Figure 7:
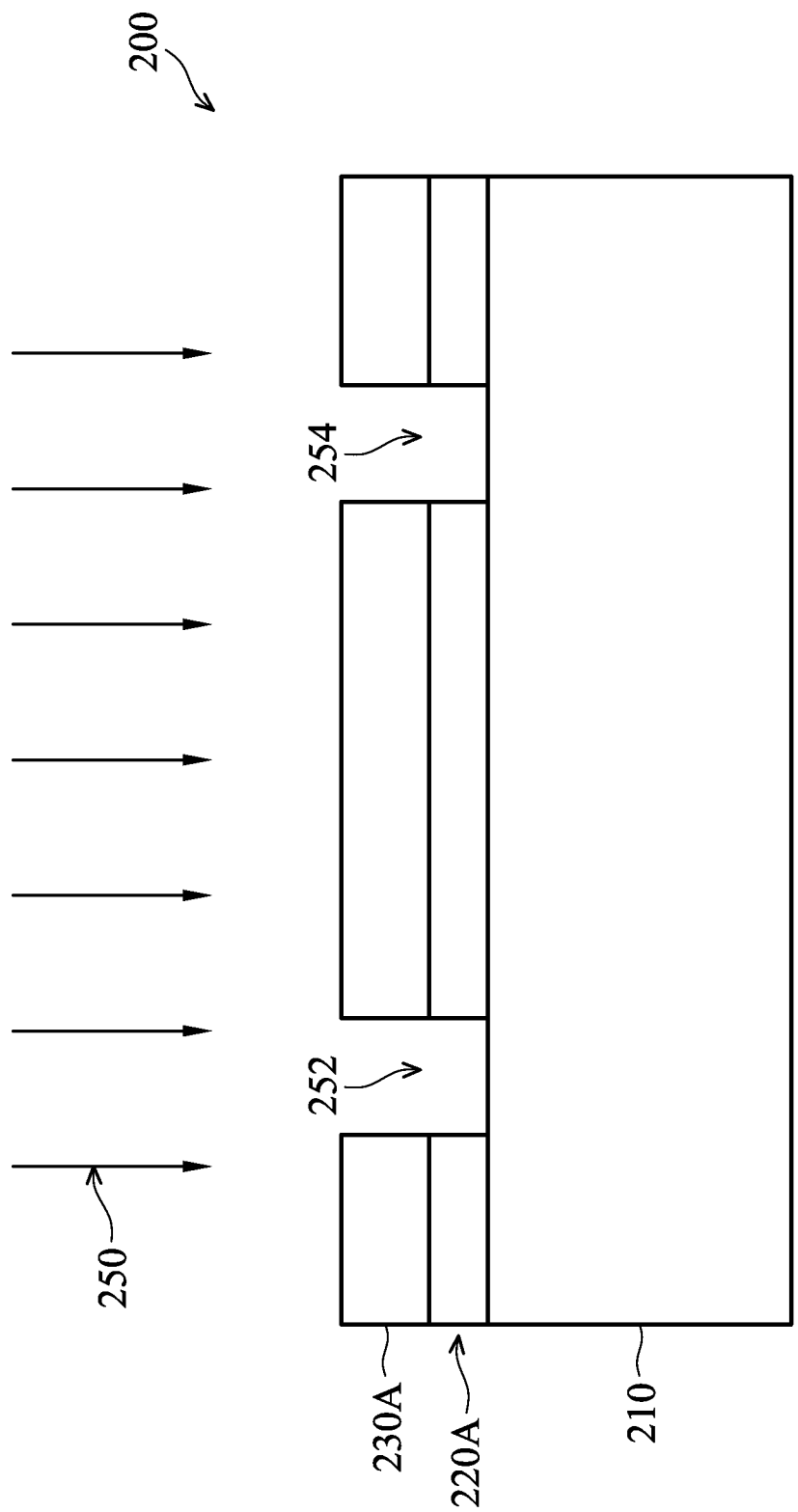

Referring to FIG. 7, an etching process 250 is performed on the conductive layer 220. The etching process 250 is a dry etching process. An exemplary dry etching process is a plasma etching process that has etching parameters that can be tuned, such as etchant used, etching pressure, radio-frequency (RF) source power, and RF bias power. For example, the etching parameters may be an etchant including $SF_6$, $CF_4$, $O_2$, or combinations thereof; an etching pressure of about 3 mili-Torr (mT) to about 8 mT; an RF source power of about 120 Watts ($W_s$) to about 400 $W_s$; and an RF bias power of about 12 $W_B$ to about 30 $W_B$. In situations where a residual layer of the material layer 230 remains over the exposed portions of the conductive layer 220, the etching process 250 removes the residual layer, or a dry etching process, such as a reactive ion etching (RIE) process, may be utilized to remove the residual layer prior to performing the etching process 250.

Figure 8:
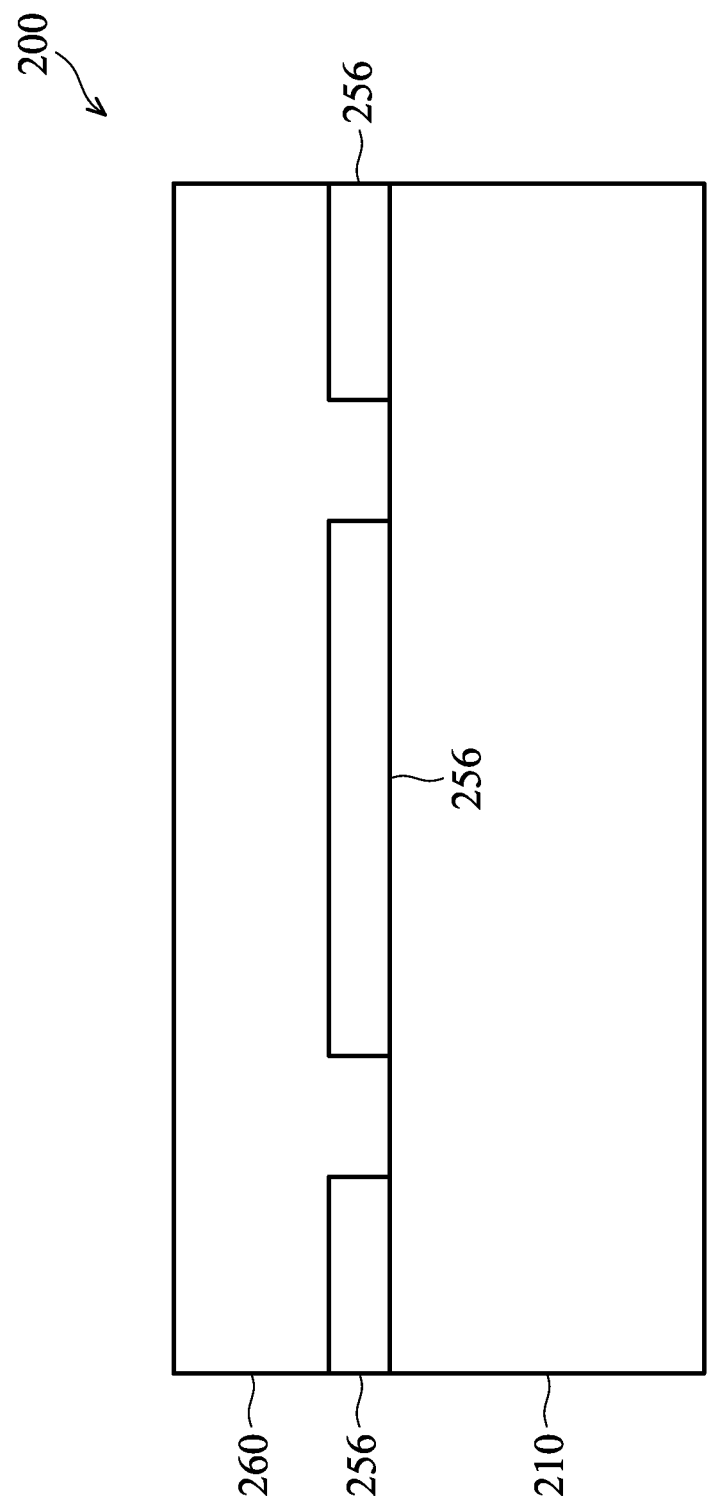

The etching process 250 transfers the pattern (or design) of the patterned material layer 230A to the conductive layer 220, thereby forming patterned conductive layer 220A. More specifically, the etching process 250 extends the openings 242 and 244 in the patterned material layer 230A to the conductive layer 220, thereby forming openings (trenches or grooves) 252 and 254 in the patterned conductive layer 220A. The openings 252 and 254 isolate portions of the conductive layer 220 from one another, and thus, may be referred to as isolation grooves. Thereafter, the remaining portions of the patterned shielding layer 230A are removed by a suitable process, such as a stripping process, leaving electrodes 256 (FIG. 8). For example, the remaining portions of the patterned material layer 230A may be removed by a solution including sulfuric acid ($H_2SO_4$) and hydrogen peroxide ($H_2O_2$). Alternatively, other solutions known in the art, including future-developed solutions, are used for removing the patterned material layer 230A. The remaining conductive layer 220 defines the back contact (BSF) for the photovoltaic device 200.

Referring to FIG. 8, an absorption layer 260 is formed over the substrate 210 and conductive layer 220. The absorption layer 260 fills the openings 252 and 254 in the conductive layer 220. The absorption layer 260 may provide electrical insulation between adjacent electrodes 256. The absorption layer 260 may be selected from a group consisting of Group II-VI compounds, Group III-V compounds, Group IV semiconductors, and combinations thereof. In the depicted embodiment, the absorption layer is a copper, indium, gallium, and selenium ($CuIn_{1-x}Ga_xSe_2$) (CIGS) layer. Alternatively, the absorption layer 260 is a silicon (Si) ink layer, such as an amorphous silicon layer. In yet another alternative, the absorption layer 260 includes GaAs, CdTe, $Cu_2S$, $Cu_2O$, InP, $Zn_3P_2$, other suitable materials, or combinations thereof. The CIGS layer is formed by a process known in the art, including future-developed processes. For example, a vacuum-based process may co-evaporate or co-sputter copper, gallium, and indium to form a film over the substrate, and then anneal the film with a selenide vapor to form the final CIGS layer. In another example, copper, gallium, indium, and selenium may be directly co-evaporated onto the substrate when the substrate is heated.

Figure 9:
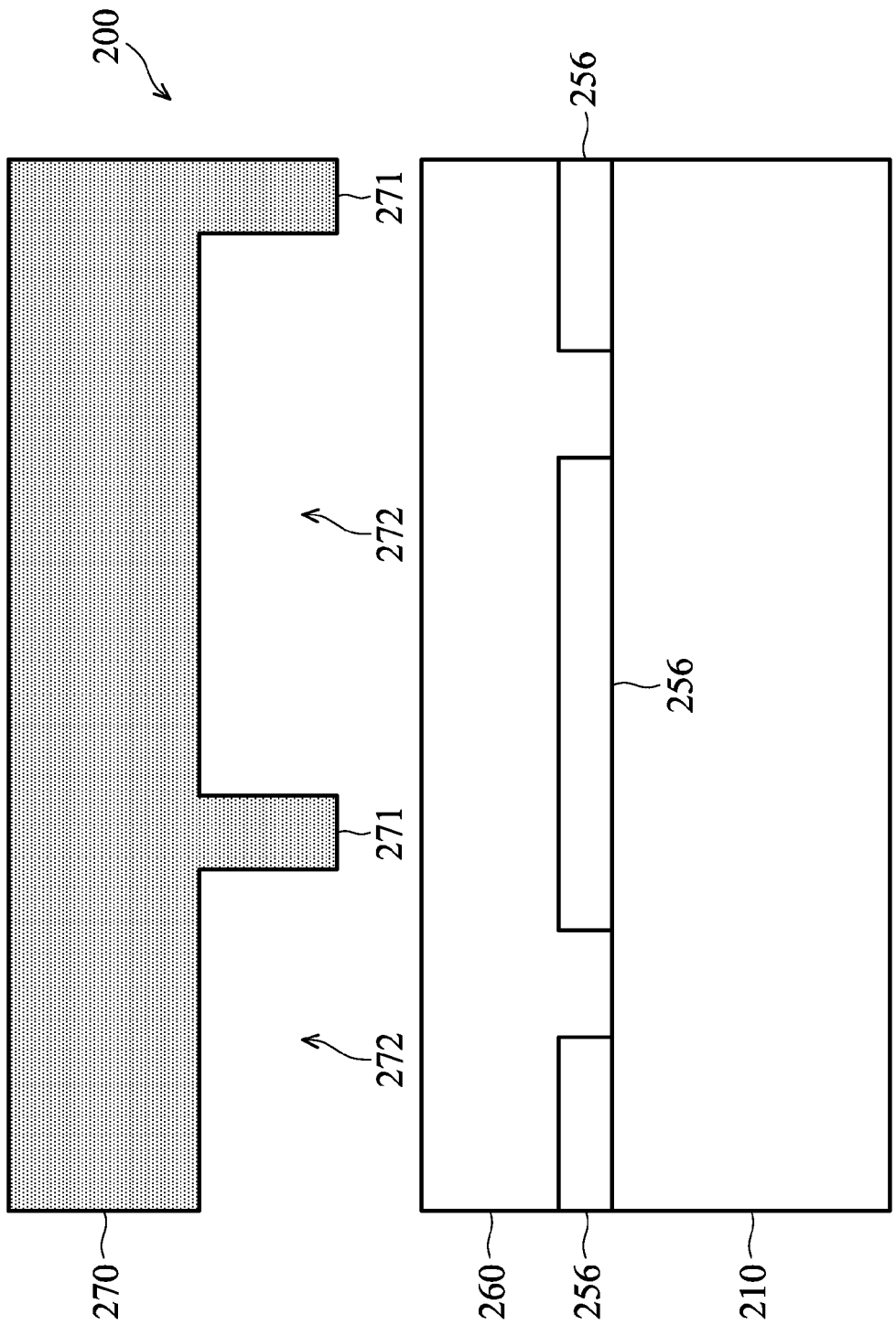
Figure 10:
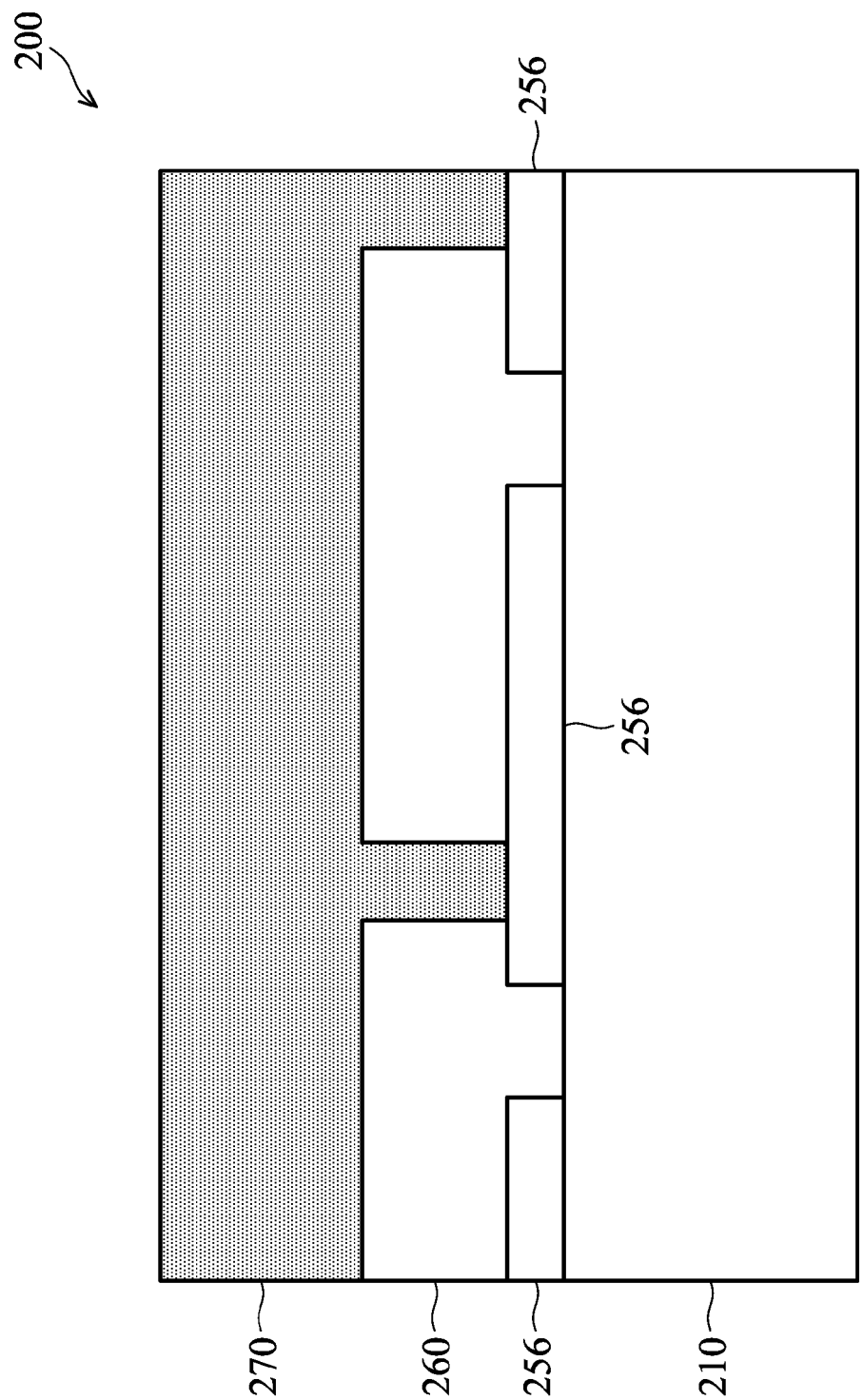
Figure 11:
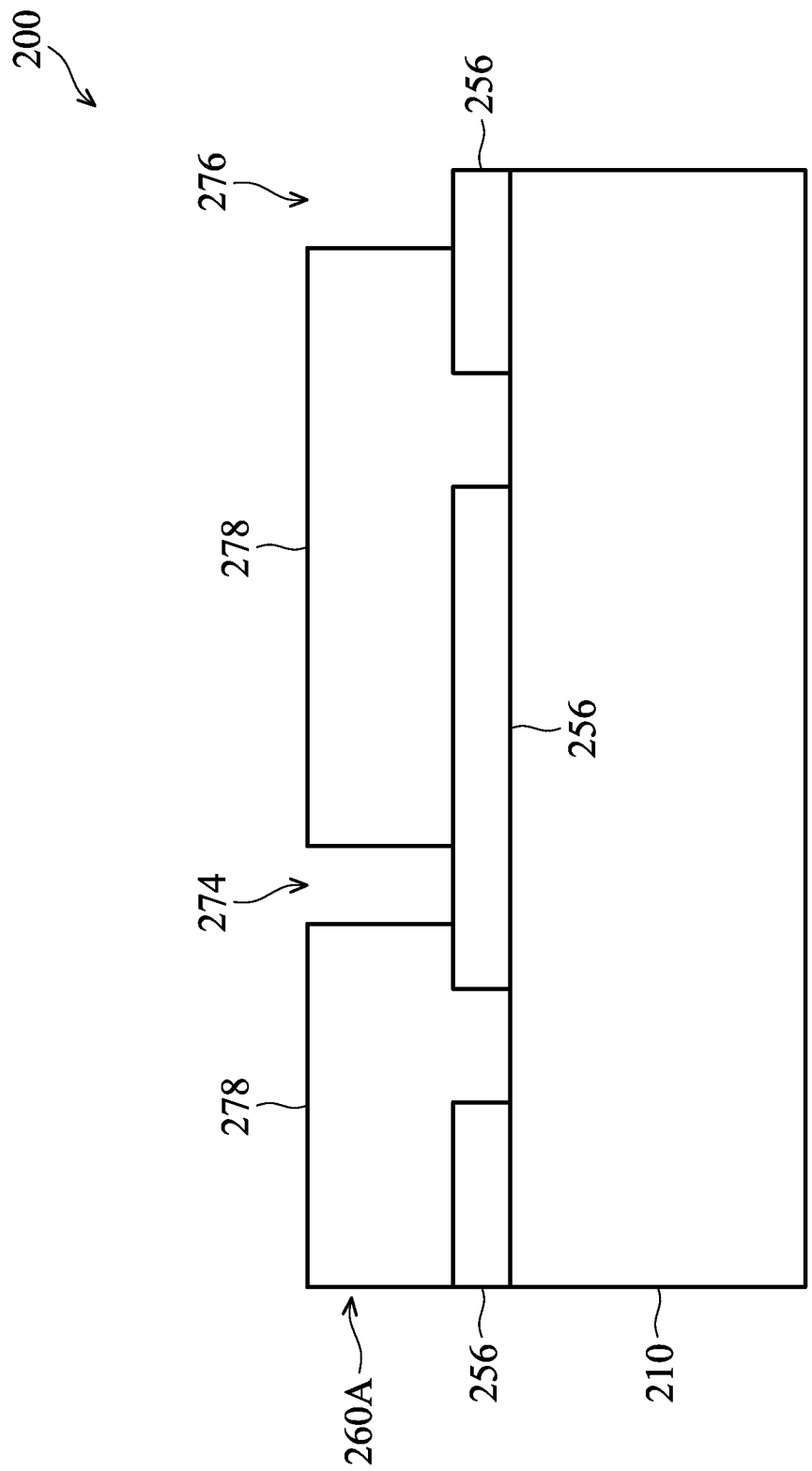

Referring to FIGS. 9-11, nanoimprint technology is also used to define and pattern the absorber layer 260. More particularly, a mold 270 is pressed into the absorption layer 260 and removed, thereby imprinting the absorption layer 260 with a predetermined pattern. The mold 270 is made of a suitable material, such as quartz ($SiO_2$), silicon, SiC, silicon nitride, metal, sapphire, diamond, resin, other suitable mold material known in the art, future-developed mold material, or combinations thereof. In an example, the mold 270 may be quartz having a patterned metal layer, such as chromium (Cr), forming the predetermined pattern. In another example, the mold 270 may be quartz having a patterned MoSi layer forming the predetermined pattern. The mold 270 includes protrusion features 271 and openings 272 (also referred to as trenches or cavities) that form the predetermined pattern. The predetermined pattern is any suitable design, and thus, the protrusion features 271 and openings 272 may have various shapes and designs depending on a particular pattern or feature desired. In the depicted embodiment, the predetermined pattern of the mold 270 defines individual cell units of the photovoltaic device 200.

The mold 270 is pressed into the absorption layer 260 (FIGS. 9 and 10) at a suitable temperature and pressure, thereby creating a thickness contrast in the absorption layer 260. More specifically, the predetermined pattern of the mold 270 is transferred to the absorption layer 260 because the absorption layer 260 underneath the protrusion features 271 is displaced and transported to the trenches or cavities 272 of the mold 270 (FIG. 10). The temperature and pressure is selected based on properties of the mold 270 and absorption layer 260. The absorption layer 260 is cured and set so that the absorption layer 260 hardens and assumes its displaced shape. This ensures that the absorption layer 260 will not flow back into the spaces created by the displacement when the mold 270 is removed. When the mold 270 is removed, a patterned absorption layer 260A remains that includes openings (grooves or trenches) 274 and 276 as illustrated in FIG. 11. The openings 274 and 276 expose portions of the electrodes 256 and isolate the absorption layer 260 into individual absorption elements 278. The patterned absorption layer 260A shields other portions of the electrodes 256 from subsequent processing. A thin residual layer of the absorption layer 260 may remain over the exposed portions of the electrodes 256, which may be removed by a suitable process. Alternatively, similar to the process used to pattern the conductive layer 220 described above, the absorption layer 260 could be patterned and defined by: forming a shielding (or intermedium) layer, similar to material layer 230, over the absorption layer; patterning the shielding layer with the mold 270, such that openings are formed in shielding layer that expose portions of the absorption layer 260; and etching the exposed portions of the absorption layer 260, thereby transferring the pattern of the shielding layer to the absorption layer 260 to form the patterned absorption layer 260A. In yet another alternative, the absorption layer 260 could be patterned by conventional photolithography patterning processes.

Figure 12:
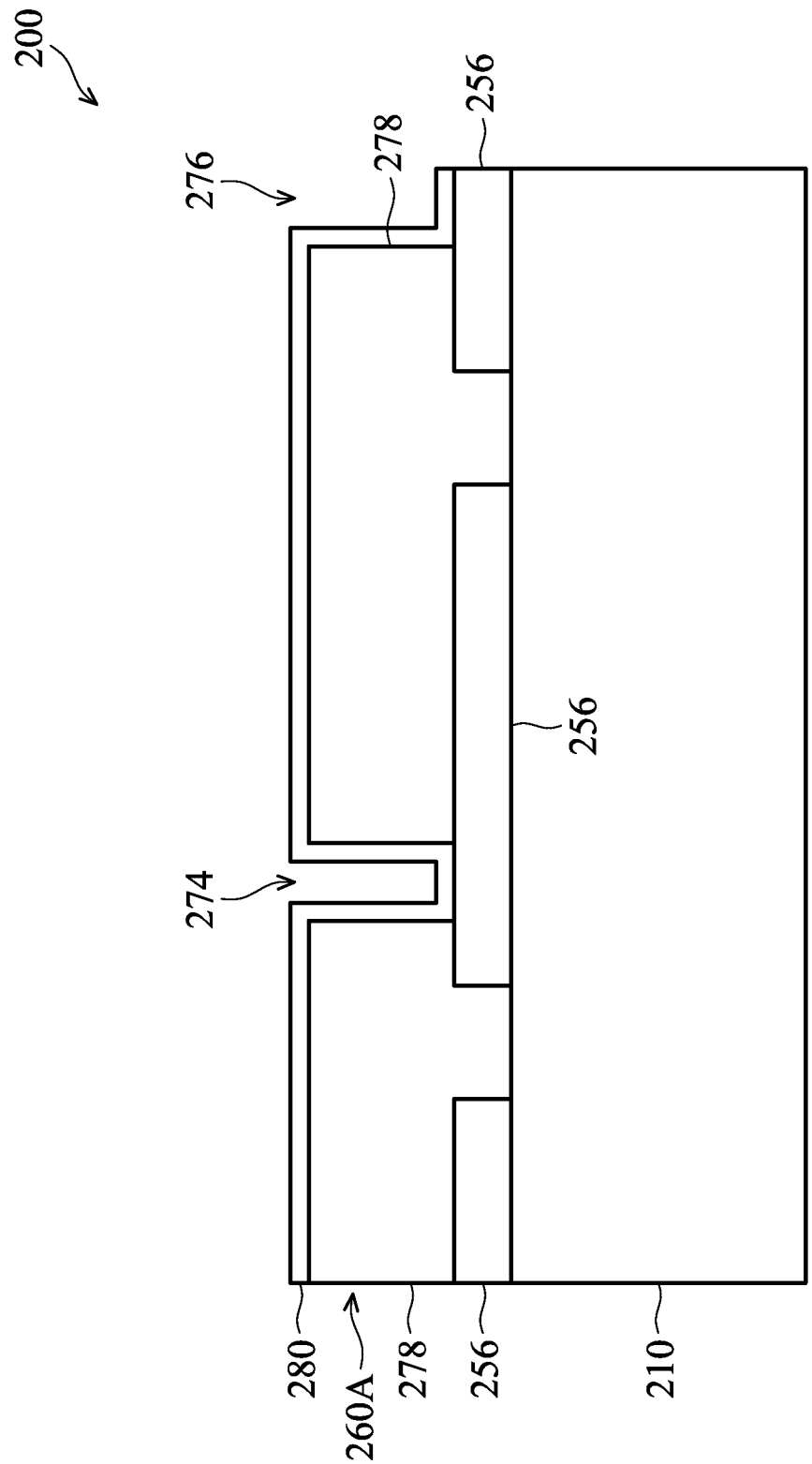

Referring to FIG. 12, a conductive layer 280 is formed over patterned absorption layer 260A/absorption elements 278. The conductive layer 280 partially fills the openings 274 and 276 between absorption elements 278, providing electrical communication between the conductive layer 280 and exposed portions of the electrodes 256. The conductive layer may completely fill the openings 274 and/or 276. The conductive layer 280 is a transparent conductive oxide (TCO), such as ZnO, ITO, $SnO_2$, $TiO_2$, $In_2O_3$, CdO, other suitable TCO material, or combinations thereof. The conductive layer 280 may alternatively or additionally be Mo, Ti, Ni, Al, Nb, W, Cr, Cu, other suitable material, or combinations thereof. The conductive layer 280 is a contact (electrode) layer of the photovoltaic device 200. The conductive layer 280 may be doped. A buffer layer may be formed between the absorption layer 260 and the conductive layer 280. The buffer layer may be CdS, CdSe, ZnS, ZnSe, an oxysulfide, other suitable material, or combinations thereof.

Figure 13:
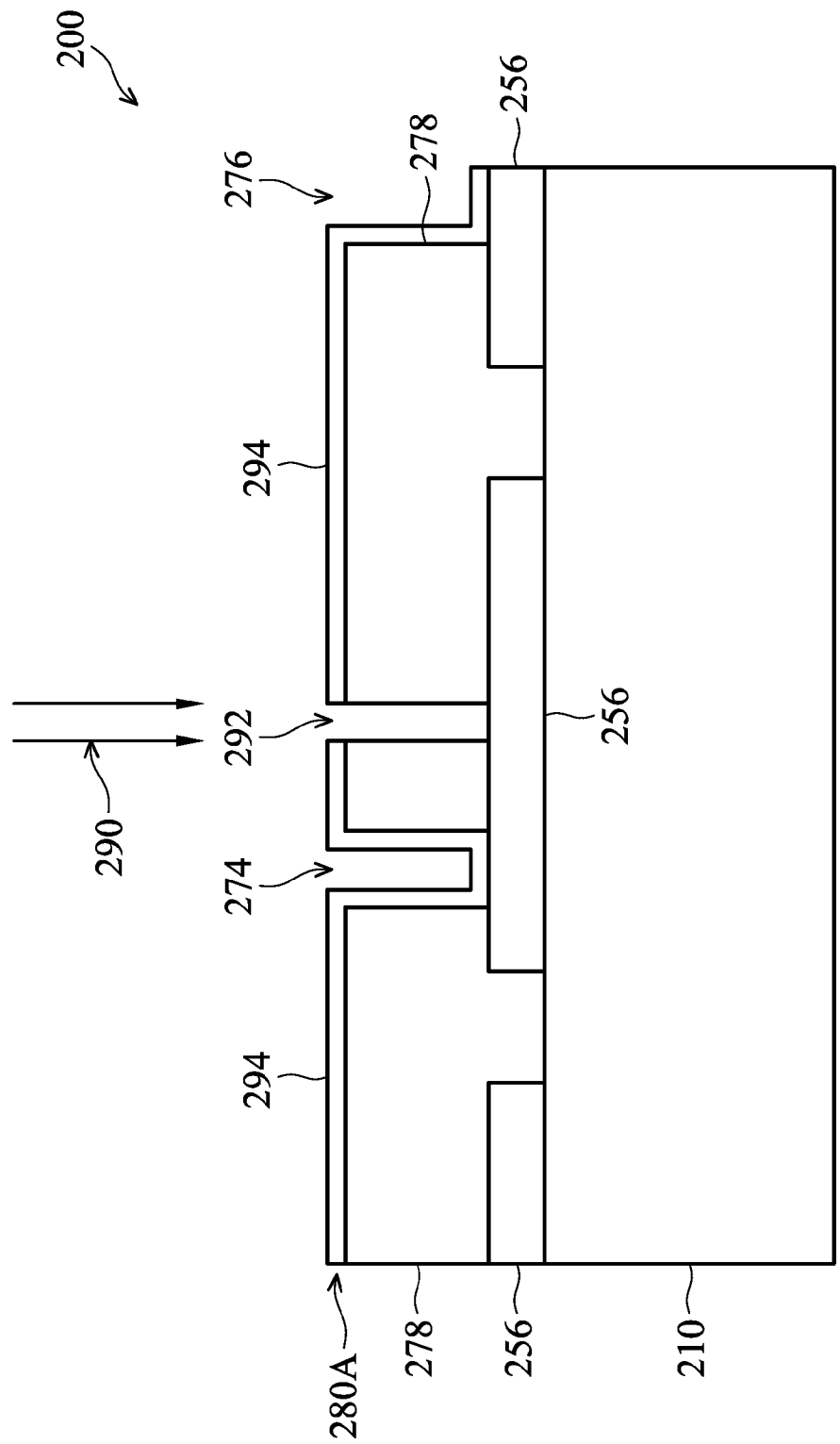
Figure 14:
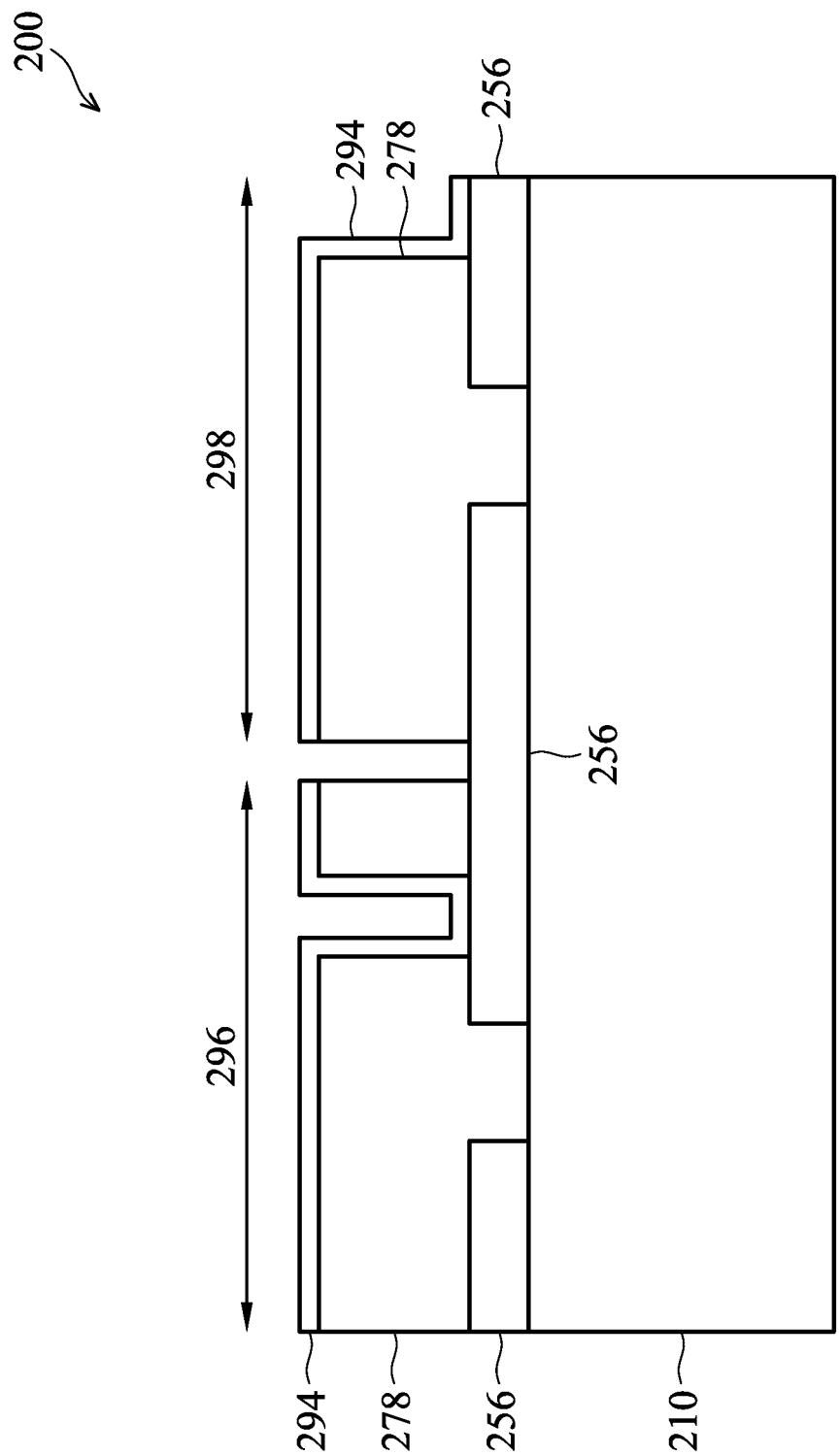

Referring to FIGS. 13 and 14, a process 290 divides the photovoltaic device 200 into individual cell units. The process 290 removes portions of the conductive layer 280 and absorption element 278, thereby forming a patterned conductive layer 280A. The patterned conductive layer 280A includes an opening (trench or groove) 292 that isolates portions of the conductive layer 280 from one another, thereby forming electrodes 294. The opening 292 exposes a portion of the electrode 256, and separates the photovoltaic device 200 into individual cell units 296 and 298. In the depicted embodiment, the process 290 is a laser scribing process. Alternatively, the process 290 is a nanoimprint process, a lithography process, an etching process, a mechanical machining process, other suitable process, or combinations thereof.

As discussed above, the disclosed photovoltaic device manufacturing uses nanoimprint technology to define, interconnect and isolate individual cells of the photovoltaic device. Nanoimprint technology provides high patterning accuracy, which can provide improved alignment within the photovoltaic cells. Further, in contrast to conventional manufacturing methods, nanoimprint technology is easily implemented into conventional roll-to-roll manufacturing processes, simplifying manufacturing of photovoltaic devices and reducing manufacturing costs. It is understood that different embodiments may have different advantages, and that no particular advantage is necessarily required of any one embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a photovoltaic device comprising:
   providing a substrate;
   forming a first conductive layer over the substrate;
   forming first grooves in the first conductive layer using a nanoimprint and etching process, the nanoimprint and etching process comprising pressing a mold having a pattern into an intermedium layer disposed over the first conductive layer and etching the first conductive layer;
   forming an absorption layer over the first conductive layer, the absorption layer filling in the first grooves;
   forming second grooves in the absorption layer using a nanoimprint process in the absorption layer;
   forming a second conductive layer over the absorption layer, the second conductive layer filling in the second grooves; and
   forming third grooves in the second conductive layer and the absorption layer, thereby defining a photovoltaic cell unit.

2. The method of claim 1 wherein the forming the first grooves in the first conductive layer using the nanoimprint and etching process includes:
   forming the intermedium layer over the first conductive layer;
   providing a mold having a pattern;
   imprinting the intermedium layer with the pattern;
   transferring the pattern from the intermedium layer to the first conductive layer; and
   removing the intermedium layer.

3. The method of claim 1 wherein the forming the second grooves in the absorption layer using the nanoimprint process in the absorption layer includes:
   providing a mold having a pattern; and
   imprinting the absorption layer with the pattern.

4. The method of claim 1 wherein the forming the third grooves includes performing a laser scribing or machining scribing process.

5. The method of claim 1 wherein the forming the third grooves includes performing a nanoimprint process.

6. The method of claim 1 wherein:
   the first conductive layer is a molybdenum layer;
   the absorption layer is a CIGS layer or a Si ink layer; and
   the second conductive layer is a transparent conducting oxide layer.

7. A method for manufacturing a photovoltaic device comprising:
   providing a substrate;
   forming a first conductive layer over the substrate;
   performing a first nanoimprint process to form a first opening within the first conductive layer and expose a portion of the substrate, the first nanoimprint process comprising pressing a mold having a pattern into a shield layer disposed over the first conductive layer;
   forming an absorption layer over the first conductive layer, the absorption layer filling the first opening;
   performing a second nanoimprint process to form a second opening within the absorption layer and expose a first portion of the first conductive layer;
   forming a second conductive layer over the absorption layer, the second conductive layer partially filling the second opening; and
   removing portions of the second conductive layer and the absorption layer to form a third opening that exposes a second portion of the first conductive layer.

8. The method of claim 7 wherein the performing the first nanoimprint process to form the first opening within the first conductive layer and expose the portion of the substrate, includes:
   forming a shielding layer over the first conductive layer;
   pressing a mold having a pattern into the shielding layer to create a patterned shielding layer having a thickness contrast pattern;
   treating the patterned shielding layer;
   removing the mold from the patterned shielding layer;
   etching the first conductive layer to expose the portion of the substrate according to the thickness contrast pattern of the patterned shielding layer; and
   thereafter, removing the patterned shielding layer.

9. The method of claim 8 wherein the etching the first conductive layer includes performing a plasma etching process.

10. The method of claim 7 wherein the performing the second nanoimprint process to form the second opening within the absorption layer and expose the first portion of the first conductive layer, includes:
    pressing a mold having a pattern into the absorption layer to create a thickness contrast in the absorption layer according to the pattern; and
    removing the mold from the absorption layer, wherein the thickness contrast creates a patterned absorption layer having the second opening.

11. The method of claim 7 wherein the removing portions of the second conductive layer and the absorption layer includes performing a laser scribing process or a machine scribing process.

12. The method of claim 7 wherein the performing the first nanoimprint process includes utilizing a first mold, and the performing the second nanoimprint process includes utilizing a second mold, the second mold being different than the first mold.

13. A method for manufacturing a thin film solar cell comprising:
   providing a substrate;
   performing a first nanoimprint process comprising using a mold having a pattern to form a first electrode over the substrate;
   performing a second nanoimprint process to form an absorption element over the first electrode; and
   forming a second electrode over the absorption element.

14. The method of claim 13 wherein the performing the first nanoimprint process to form the first electrode over the substrate includes:
   forming a first conductive layer over the substrate;
   forming a shielding layer over the first conductive layer;
   providing a first mold having a first pattern;
   pressing the first mold having the first pattern into the shielding layer, thereby creating a thickness contrast in the shielding layer according to the first pattern;
   removing the first mold from the shielding layer, wherein the thickness contrast creates a patterned shielding layer having an opening that exposes the first conductive layer;
   etching the first conductive layer within the opening; and
   thereafter, removing the patterned shielding layer.

15. The method of claim 14 wherein the etching the first conductive layer includes performing a plasma etching process.

16. The method of claim 14 wherein the performing the second nanoimprint process to form the absorption element over the first electrode includes:
   forming an absorption layer over the substrate and first electrode;
   providing a second mold having a second pattern;
   pressing the second mold having the second pattern into the absorption layer, thereby creating a thickness contrast in the absorption layer according to the second pattern; and
   removing the second mold from the absorption layer, wherein the thickness contrast creates a patterned absorption layer having an opening that exposes the first electrode.

17. The method of claim 16 wherein:
   the performing the etching the first conductive layer includes forming an opening within the first conductive layer, such that a portion of the substrate is exposed; and
   the forming the absorption layer over the substrate and first electrode includes filling the opening within the first conductive layer with the absorption layer.

18. The method of claim 16 wherein the forming the second electrode over the absorption element includes forming a second conductive layer over the patterned absorption layer, wherein the second conductive layer partially fills the opening that exposes the first electrode.

19. The method of claim 18 including dividing the first electrode, second electrode, and absorption element into individual cell units.

20. The method of claim 19 wherein the dividing the first electrode, second electrode, and absorption element into individual cell units includes performing a laser scribing process to form an opening within the second electrode and the absorption element, wherein a portion of the first electrode is exposed by the opening.

* * * * *